United States Patent
Chen et al.

(10) Patent No.: US 10,879,120 B2
(45) Date of Patent: Dec. 29, 2020

(54) SELF ALIGNED VIA AND METHOD FOR FABRICATING THE SAME

(71) Applicant: Taiwan Semiconductor Manufacturing Company Limited, Hsinchu (TW)

(72) Inventors: Chih-Liang Chen, Hsinchu (TW); Cheng-Chi Chuang, New Taipei (TW); Chih-Ming Lai, Hsinchu (TW); Chia-Tien Wu, Taichung (TW); Charles Chew-Yuen Young, Cupertino, CA (US); Jiann-Tyng Tzeng, Hsinchu (TW); Kam-Tou Sio, Hsinchu County (TW); Ru-Gun Liu, Hsinchu County (TW); Wei-Cheng Lin, Taichung (TW); Lei-Chun Chou, Taipei (TW)

(73) Assignees: Taiwan Semiconductor Manufacturing, Hsinchu (TW); Company Limited, Hsinchu (TW)

( * ) Notice: Subject to any disclaimer, the term of this patent is extended or adjusted under 35 U.S.C. 154(b) by 59 days.

(21) Appl. No.: 15/611,896

(22) Filed: Jun. 2, 2017

(65) Prior Publication Data

US 2018/0151432 A1    May 31, 2018

Related U.S. Application Data

(60) Provisional application No. 62/426,701, filed on Nov. 28, 2016.

(51) Int. Cl.
*H01L 21/768* (2006.01)
*H01L 21/311* (2006.01)
(Continued)

(52) U.S. Cl.
CPC .. *H01L 21/76897* (2013.01); *H01L 21/31111* (2013.01); *H01L 21/76816* (2013.01);
(Continued)

(58) Field of Classification Search
CPC ......... H01L 21/76897; H01L 21/76832; H01L 21/76834; H01L 21/76816;
(Continued)

(56) References Cited

U.S. PATENT DOCUMENTS 6,580,137 B2 *   6/2003  Parke ................ H01L 29/66742
                                                  257/401
7,312,146 B2 *  12/2007  Cheung ................. H01L 21/288
                                                  257/E21.174
(Continued)

OTHER PUBLICATIONS

Taiwan office action; Application No. 106128563; dated May 8, 2020.

*Primary Examiner* — Latanya N Crawford Eason
(74) *Attorney, Agent, or Firm* — Jones Day

(57) ABSTRACT

A self aligned via and a method for fabricated a semiconductor device using a double-trench constrained self alignment process to form the via. The method includes forming a first trench and depositing a first metal into the first trench. Afterwards, the process includes depositing a dielectric layer over the first metal such that a top surface of the dielectric layer is at substantially the same level as the top surface of the first trench. Next, a second trench is formed and a via is formed by etching the portion of the dielectric layer exposed by the overlapping region between the first trench and the second trench. The via exposes a portion of the first metal and a second metal is deposited into the second trench such that the second metal is electrically coupled to the first metal.

20 Claims, 20 Drawing Sheets

(51) Int. Cl.
*H01L 23/522* (2006.01)
*H01L 23/528* (2006.01)
*H01L 23/532* (2006.01)
*H01L 21/02* (2006.01)

(52) U.S. Cl.
CPC .. *H01L 21/76832* (2013.01); *H01L 21/76834* (2013.01); *H01L 21/76877* (2013.01); *H01L 21/76885* (2013.01); *H01L 23/528* (2013.01); *H01L 23/5226* (2013.01); *H01L 23/53209* (2013.01); *H01L 23/53228* (2013.01); *H01L 23/53257* (2013.01); *H01L 23/53295* (2013.01); *H01L 21/0217* (2013.01); *H01L 21/02126* (2013.01); *H01L 21/02164* (2013.01); *H01L 21/02167* (2013.01); *H01L 21/02178* (2013.01); *H01L 21/76883* (2013.01)

(58) Field of Classification Search
CPC ........... H01L 21/02167; H01L 21/0217; H01L 21/76808; H01L 21/76813; H01L 2221/1021; H01L 2221/1073; H01L 2221/10768; H01L 21/76885; H01L 21/31111; H01L 21/76877; H01L 21/76883
See application file for complete search history.

(56) References Cited

U.S. PATENT DOCUMENTS

| | | | |
|---|---|---|---|
| 9,659,821 B1* | 5/2017 | Chen | H01L 21/76897 |
| 9,685,406 B1* | 6/2017 | Briggs | H01L 23/528 |
| 9,953,865 B1* | 4/2018 | Briggs | H01L 21/76831 |
| 2002/0192911 A1* | 12/2002 | Parke | H01L 29/78645 438/270 |
| 2010/0093168 A1* | 4/2010 | Naik | H01L 21/31144 438/618 |
| 2012/0043632 A1* | 2/2012 | Nikolic | G01T 3/08 257/429 |
| 2013/0328208 A1* | 12/2013 | Holmes | H01L 21/76883 257/774 |
| 2014/0264926 A1* | 9/2014 | Wu | H01L 23/481 257/774 |
| 2015/0130073 A1* | 5/2015 | Sung | H01L 23/5226 257/774 |
| 2015/0171010 A1* | 6/2015 | Bristol | H01L 23/522 257/774 |
| 2015/0371895 A1* | 12/2015 | Yokomichi | H01L 21/76897 438/381 |
| 2016/0049364 A1* | 2/2016 | Edelstein | H01L 23/5226 257/774 |
| 2016/0155664 A1* | 6/2016 | Chan | H01L 21/76877 438/643 |
| 2016/0197011 A1* | 7/2016 | Bristol | H01L 21/76897 257/760 |
| 2017/0271202 A1* | 9/2017 | Xu | H01L 21/76807 |
| 2018/0040510 A1* | 2/2018 | Briggs | H01L 21/76897 |
| 2018/0122690 A1* | 5/2018 | Bristol | H01L 21/0335 |
| 2018/0130657 A1* | 5/2018 | Duan | H01L 21/0337 |
| 2019/0295943 A1* | 9/2019 | Tan | H01L 21/76843 |

* cited by examiner

SELF ALIGNED VIA AND METHOD FOR FABRICATING THE SAME

CROSS-REFERENCE TO RELATED APPLICATIONS

This application claims priority to U.S. Provisional Application No. 62/426,701, filed Nov. 28, 2016, entitled "Self Aligned Via and Method for Fabricating the Same," which is incorporated herein by reference in its entirety.

TECHNICAL FIELD

This relates to a self aligned via and more particularly to a self aligned via fabricated using a double-trench constrained self alignment process.

BACKGROUND

Semiconductor devices may include several layers. Some of the layers may include conductive paths for interconnecting various parts of the semiconductor device. In some instances, conductive paths in one layer may need to be electrically coupled to conductive paths in another layer. To accomplish this connection between layers, a via may be used.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
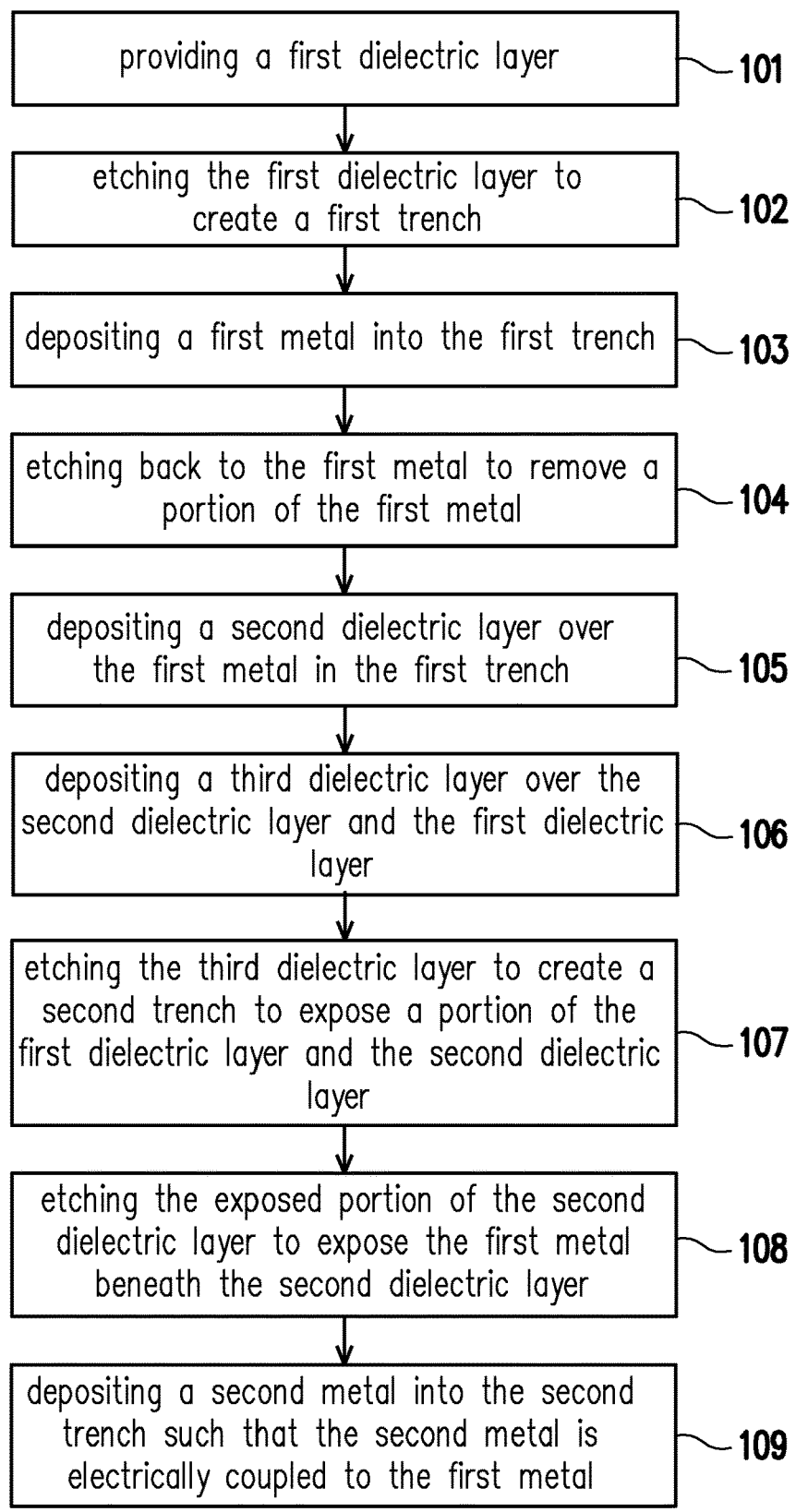
FIG. 1 is a flow chart illustrating a first method for fabricating a self aligned via, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Semiconductor devices continue to get smaller. As the size of the device gets smaller, the distance between conductive paths may decrease and, as a result, tolerances for misalignment decrease. Accordingly, in some semiconductor devices, there may be challenges associated with fabricating a via that is properly aligned. In certain implementations, a misaligned via may cause a short or a voltage breakdown within the semiconductor device.

The present disclosure provides a self aligned via and method of fabricating the same that may address one or more of the disadvantages of an existing via and fabricating methods associated with the same. In some embodiments, the self aligned via may utilize a double-trench constrained self alignment fabrication process to ensure the via is properly aligned within the semiconductor device.

FIG. 1 is a flow chart illustrating a first method for fabricating a self aligned via, in accordance with some embodiments. FIG. 1 is discussed in conjunction with FIGS. 2A-2J and FIG. 3A-3L which are schematic representations of the corresponding semiconductor device at various stages of fabrication. FIGS. 2A-2J are perspective views of a semiconductor device comprising a self aligned via at various stages of fabrication according to the first method described with respect to FIG. 1, in accordance with some embodiments. FIGS. 3A-3L are cross-sectional views of a semiconductor device comprising a self aligned via at various stages of fabrication according to the first method described with respect to FIG. 1, in accordance with some embodiments.

Figure 2A:
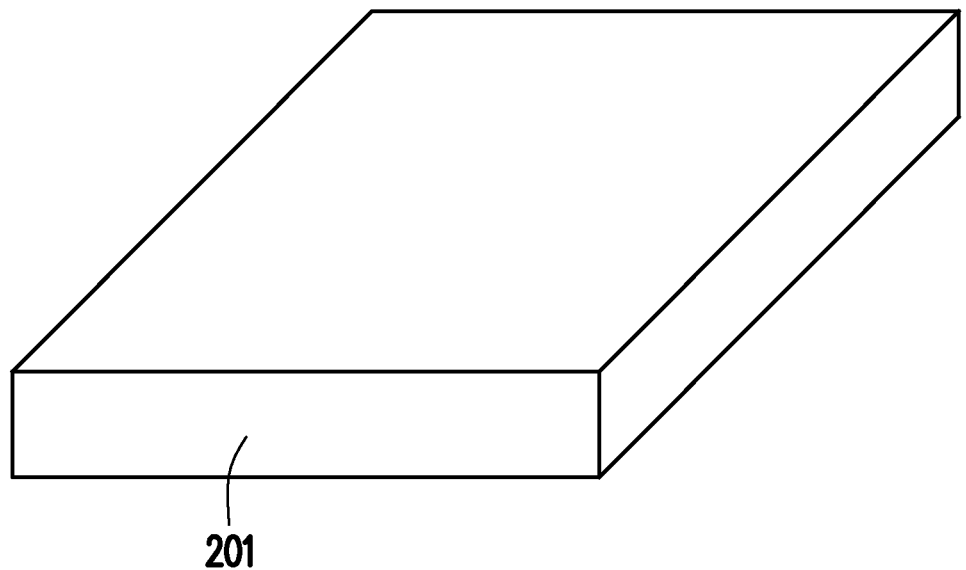
FIGS. 2A-2J are perspective views of a semiconductor device comprising a self aligned via at various stages of fabrication according to the first method described with respect to FIG. 1, in accordance with some embodiments.
Figure 2B:
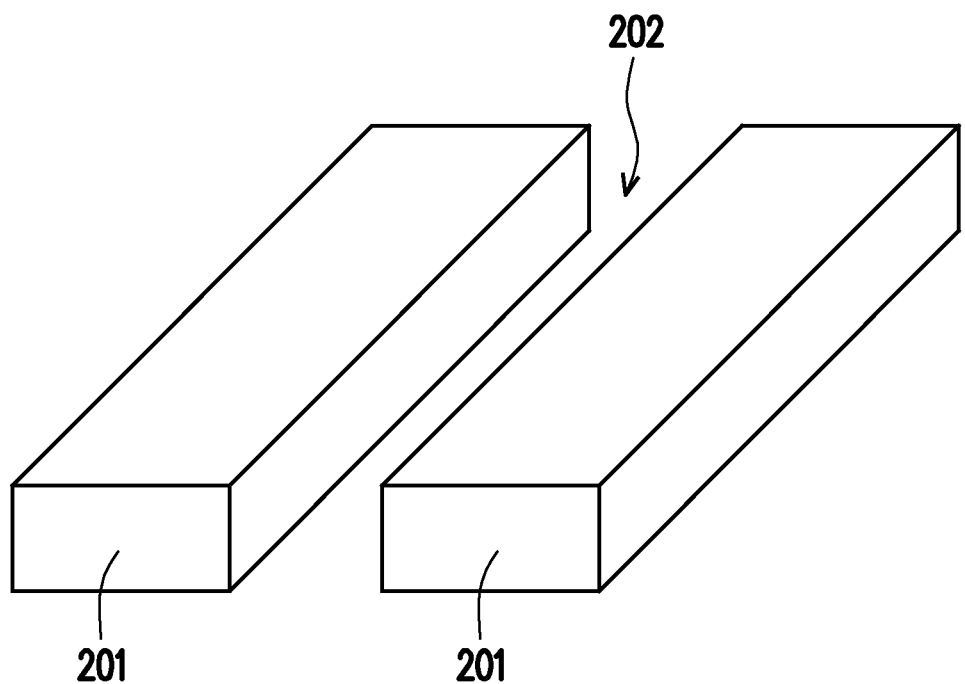
Figure 3A:
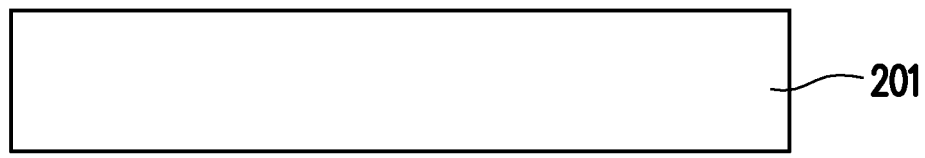
FIGS. 3A-3L are cross-sectional views of a semiconductor device comprising a self aligned via at various stages of fabrication according to the first method described with respect to FIG. 1, in accordance with some embodiments.
Figure 3B:
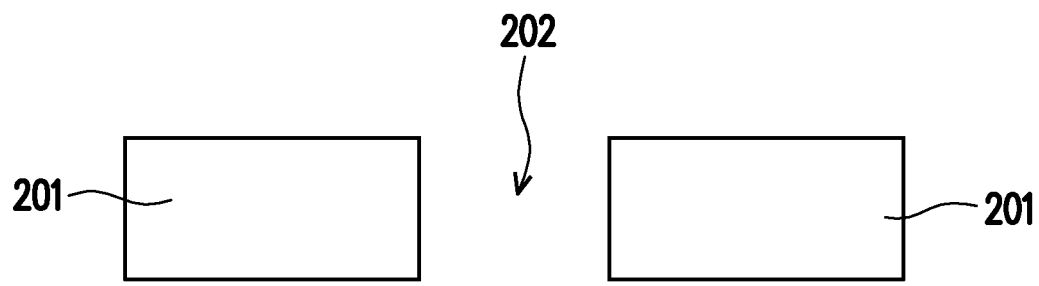

The fabrication process begins at operation 101 by providing a first dielectric layer 201. The dielectric layer 201 may be an inter metal dielectric (IMD) layer. Examples of acceptable dielectric layers include silicon oxide, silicon carbon oxide, silicon nitride, silicon carbon nitride, aluminum oxide, etc. FIG. 2A and FIG. 3A illustrate an example of dielectric layer 201. At operation 102, the first dielectric layer 201 is etched to create a first trench 202. The etching process may be performed by any of several processes (e.g., chemical, mechanical, etc.). Additionally, the first trench 202 may be fabricated such that it extends in a first direction as illustrated in FIG. 2B. FIG. 3B illustrates a cross-sectional view of the trench 202.

Figure 2C:
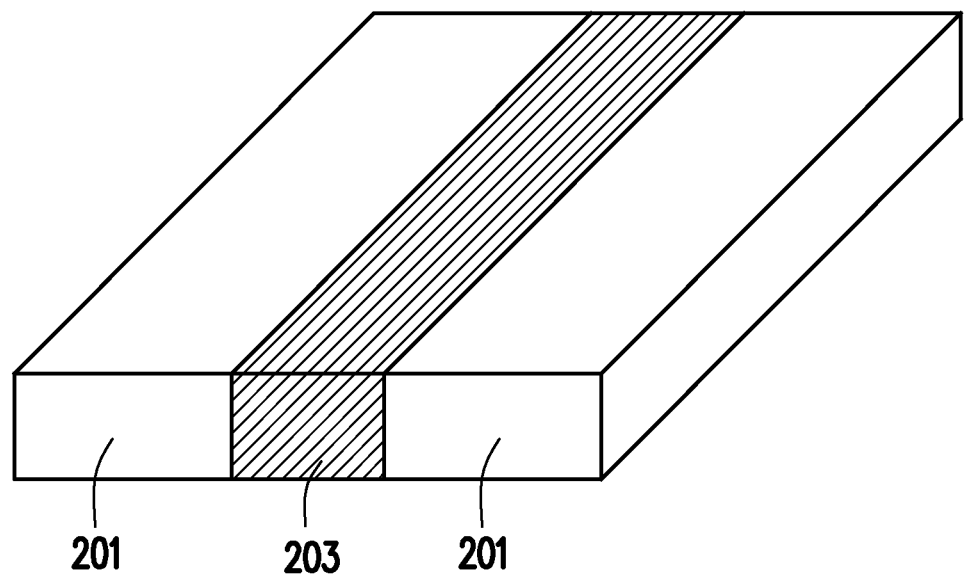
Figure 2D:
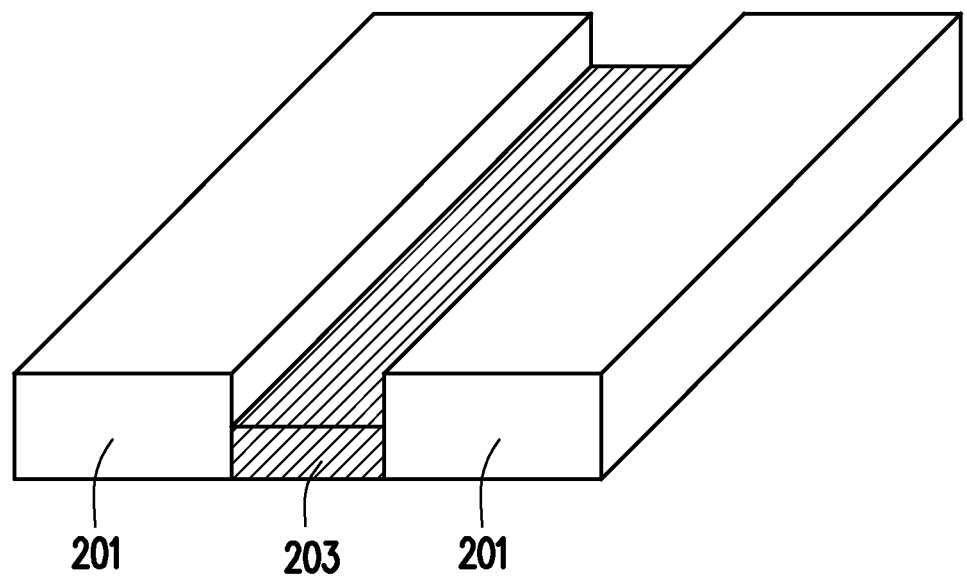
Figure 3C:
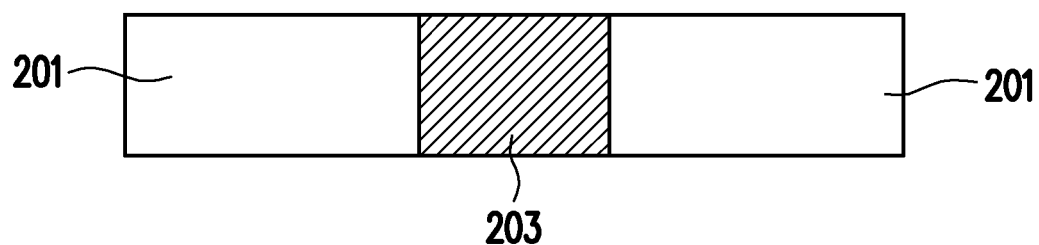
Figure 3D:
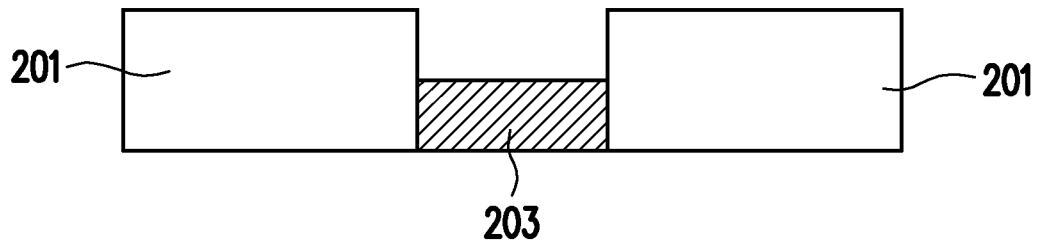

At operation 103, the trench 202 is filled with a first metal 203. The first metal 203 represents a conductive path on a certain layer of the semiconductor device. Acceptable metals for use as first metal 203 include copper, cobalt, tungsten, nickel, and combinations thereof. As illustrated in FIG. 2C and FIG. 3C, the first metal 203 may completely fill the trench 202. In some embodiments, the first metal 203 may not completely fill the trench 202. In operation 104, a portion of the first metal 203 is removed. As illustrated in FIG. 2D and FIG. 3D, the removal of a portion of the first metal 203 causes the top surface of the first metal 203 to be below the top surface of the first dielectric layer 201. In some embodiments, operations 103 and 104 may be combined into a single operation by depositing a desired amount of the first metal 203 into the trench 202 in a manner such that further etching is not necessary.

Figure 2E:
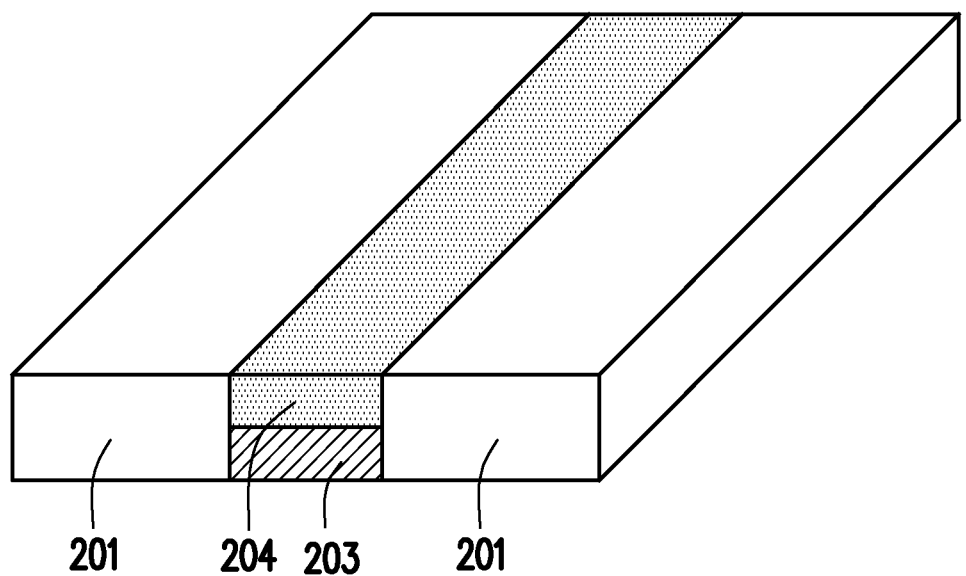
Figure 2F:
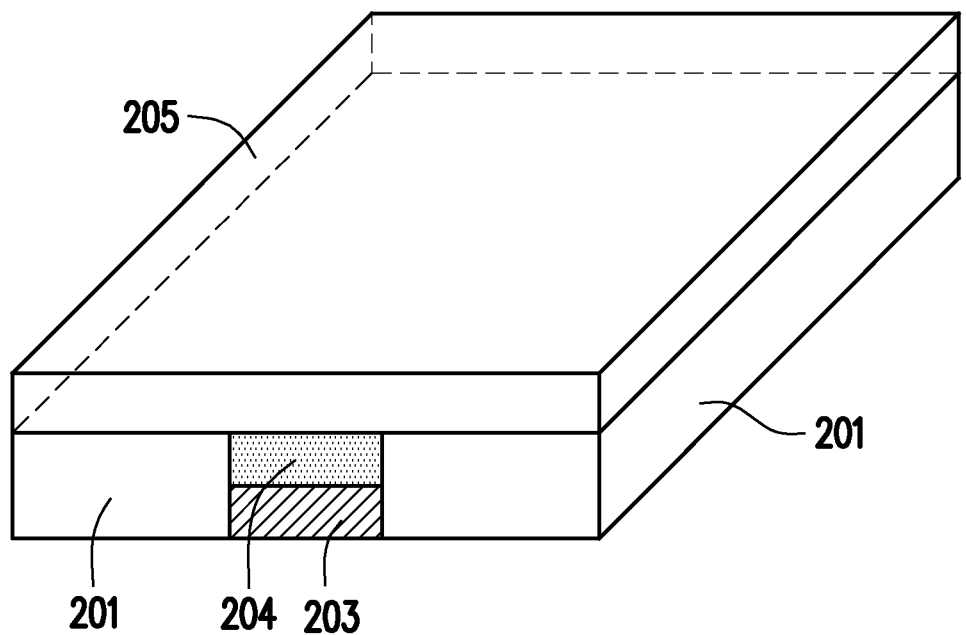
Figure 3E:
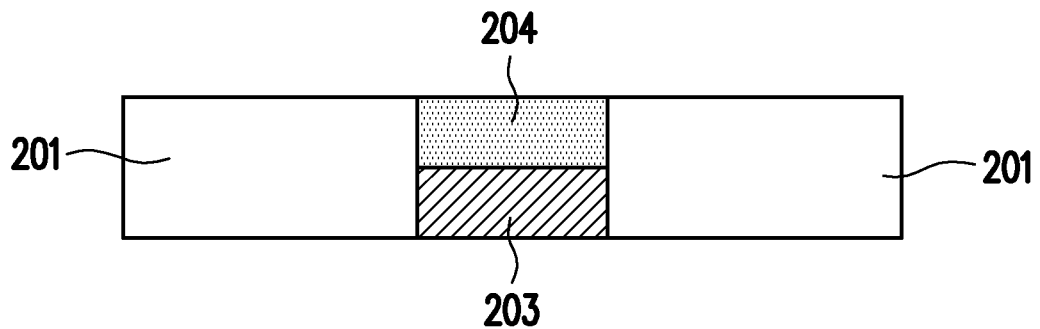
Figure 3F:
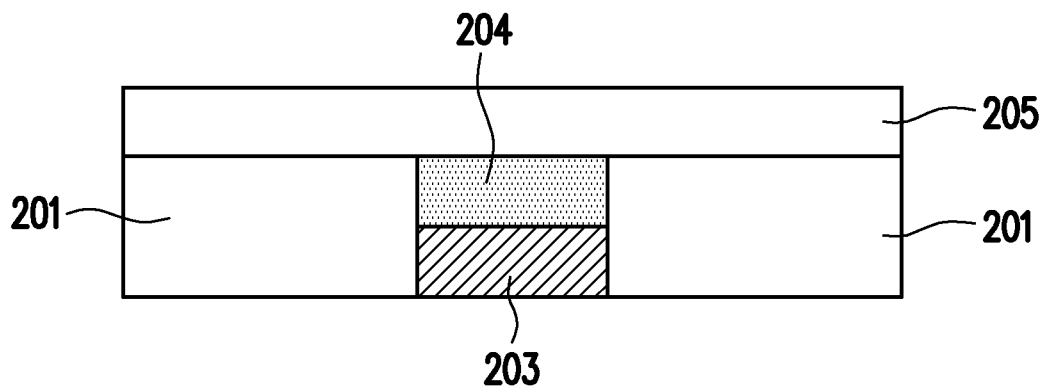
Figure 3G:
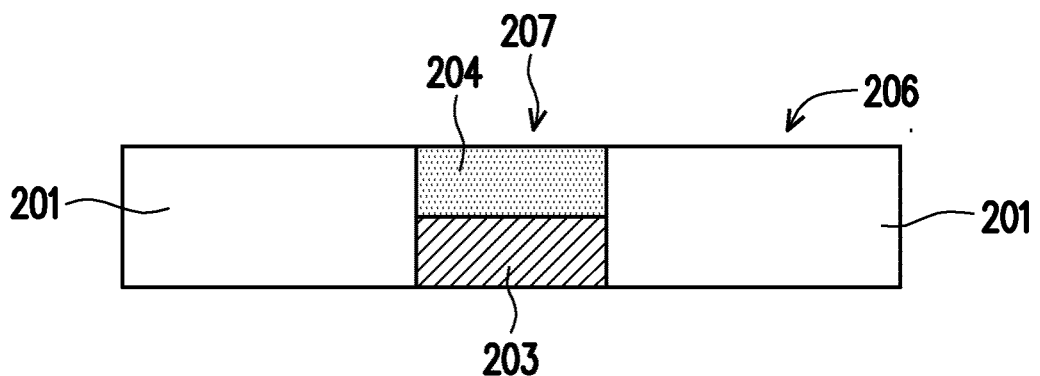

In operation 105, a second dielectric layer 204 is deposited over the first metal layer 203. As illustrated in FIG. 2E and FIG. 3E, the second dielectric layer 204 may fill the remaining portion of the first trench 202 such that the upper surface of the second dielectric layer 204 is flush with the upper surface of the first dielectric layer 201. In some embodiments, the first dielectric layer 201 and the second dielectric layer 204 may be different materials that have different etching sensitivities. As explained in more detail below, by having different etching sensitivities, the layers can be selectively etched. In operation 106, a third dielectric layer 205 is deposited over the second dielectric layer and the first dielectric layer as shown in FIG. 2F and FIG. 3F. In some embodiments, the third dielectric layer 205 and the second dielectric layer 204 may be different materials that have different etching sensitivities. In some embodiments, the third dielectric layer 205 and the first dielectric layer 201 may be the same material or may be different materials that have different etching sensitivities.

Figure 2G:
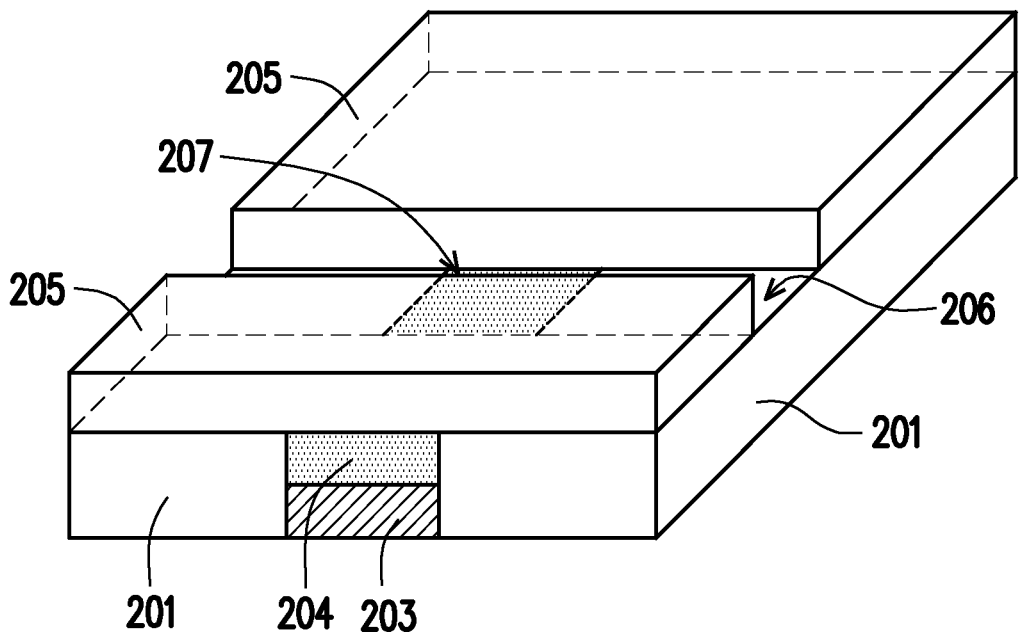
Figure 2H:
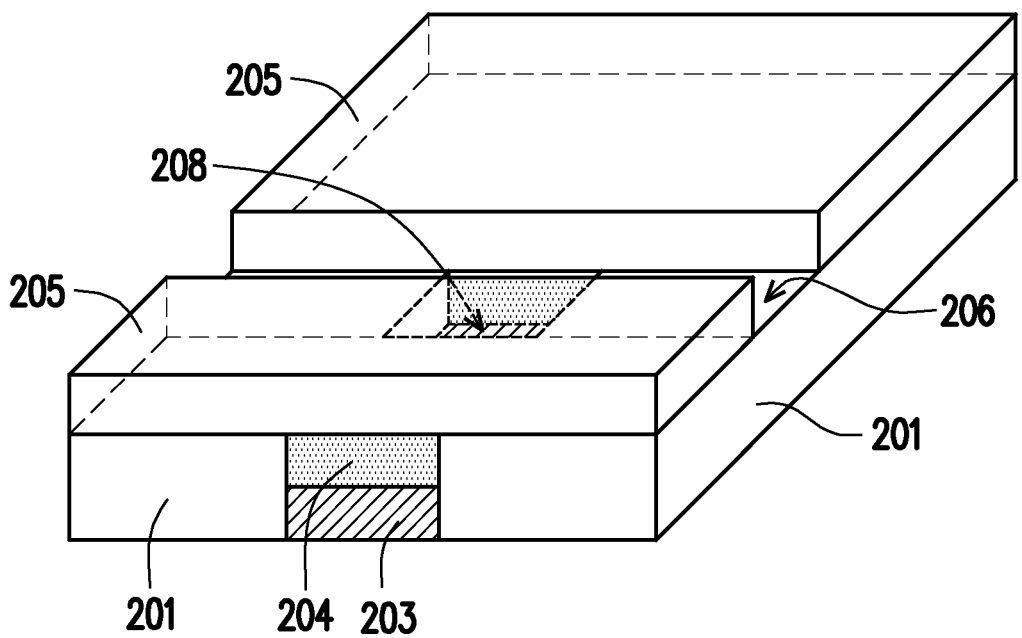
Figure 3H:
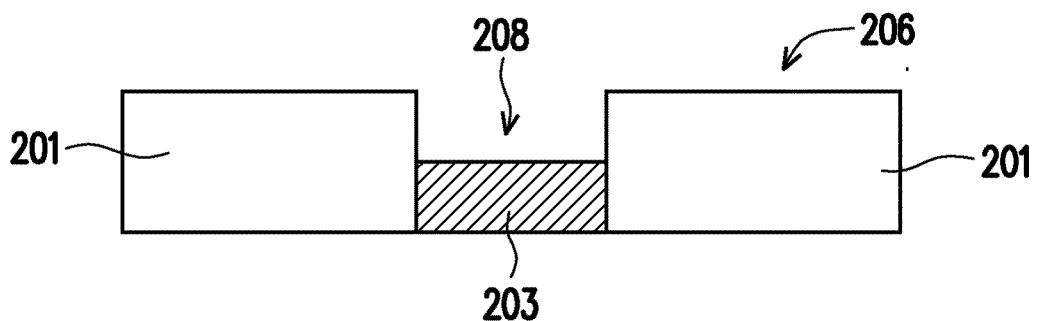

After the third dielectric layer 205 is deposited, the third dielectric layer 205 is etched to create a second trench 206 to expose a portion of the first dielectric layer 201 and a portion of the second dielectric layer 204, in operation 107. As illustrated in FIG. 2G (and FIG. 3G which is a cross-sectional view of FIG. 2G taken across the length of the second trench 206), the second trench 206 may extend in a second direction that is different from the first direction that the first trench 202 extends. In some embodiments, the first direction and the second direction may be substantially perpendicular to one another. In operation 108, the exposed portion of the second dielectric layer 204 is selectively etched to expose a portion of the first metal 203. As discussed above, because the second dielectric layer 204 is a different material than the first dielectric layer 201 and the third dielectric material 205, the second dielectric layer 204 can be selectively etched. As illustrated in FIG. 2H and FIG. 3H, the first dielectric layer 201 bounds (or constrains) the second dielectric material on two sides and the third dielectric layer 205 bounds (or constrains) the second dielectric material on the other two sides. Accordingly, when the second dielectric layer 204 is selectively etched, the resulting via 208 is self aligned over the first metal 203 because of the double trench created by the first dielectric layer 201 and the second dielectric layer 205.

Figure 2I:
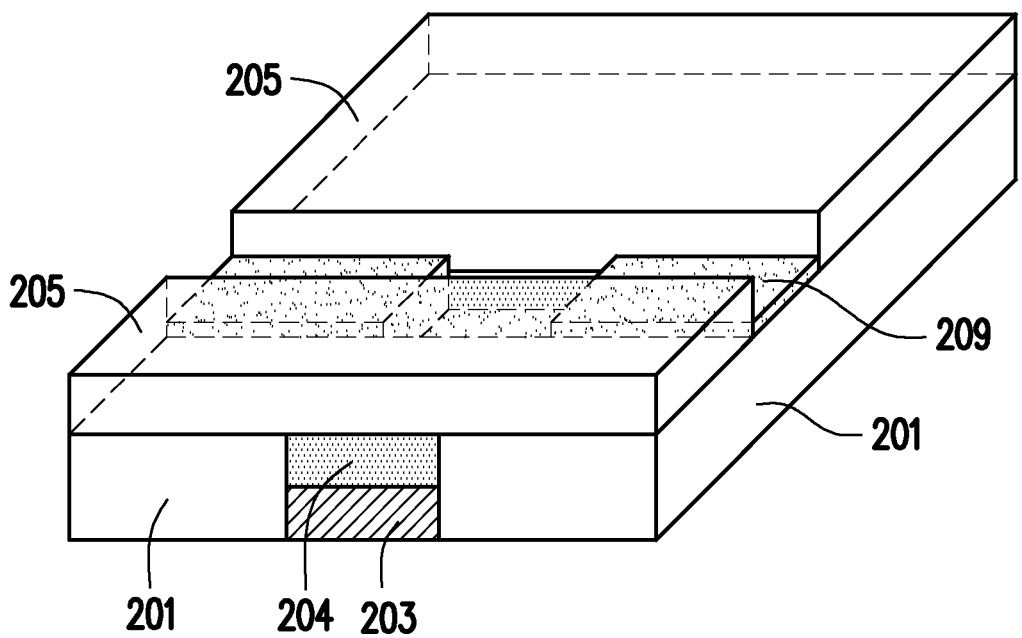
Figure 2J:
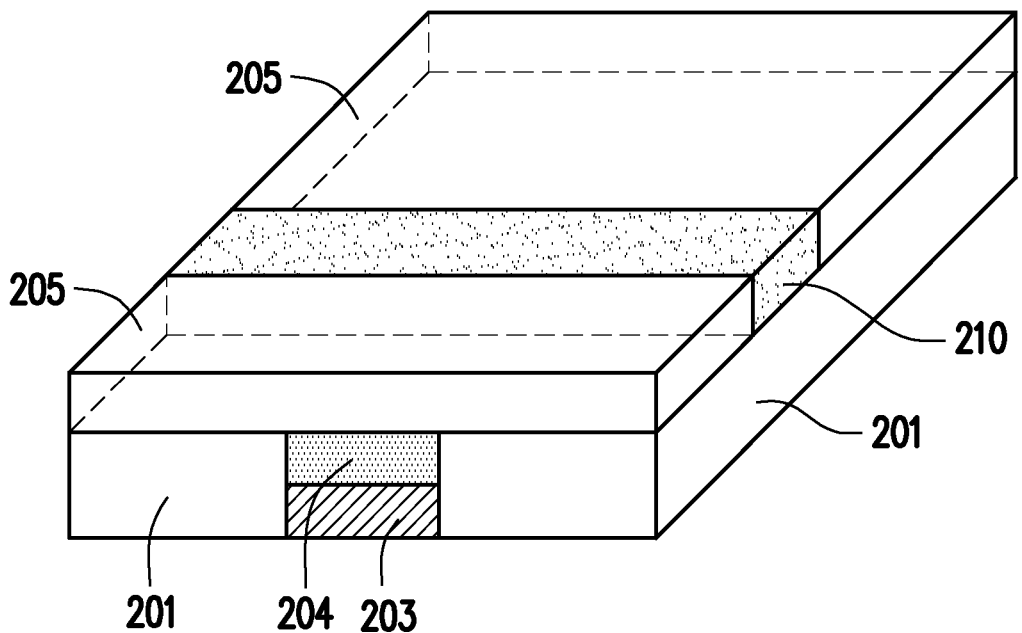
Figure 3I:
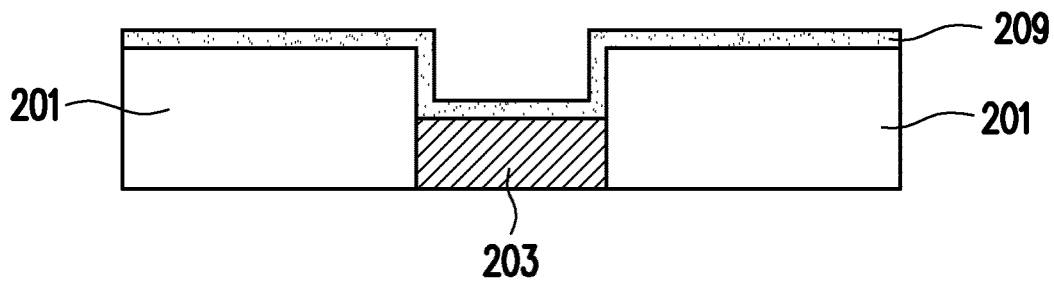
Figure 3J:
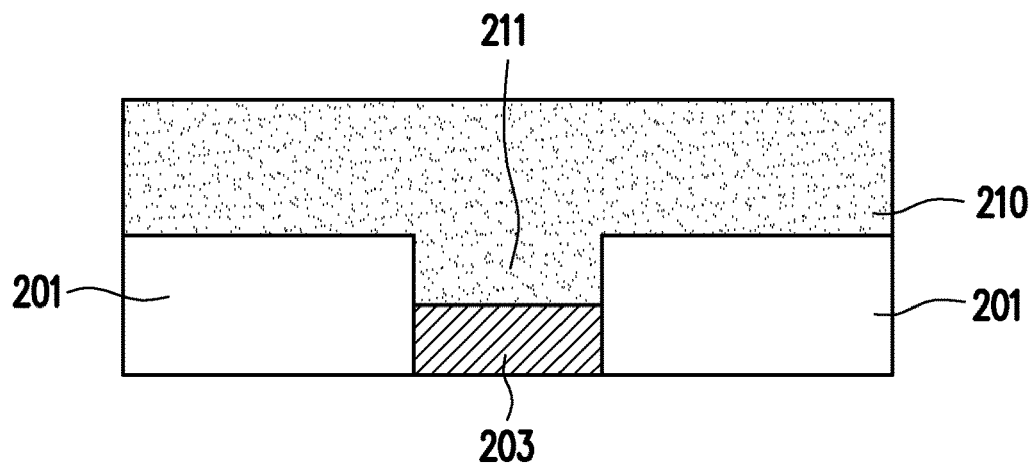

In operation 109, a second metal 209, 210, 211 is deposited into the second trench 207 such that the second metal is electrically coupled to the first metal 203. In some embodiments, this process may be completed in a single step or in two steps. FIG. 2I, FIG. 2J, FIG. 3I and FIG. 3J illustrate a two step process. As shown in FIG. 2I and FIG. 3I, a first layer 209 is applied into the trench 207 and via 208. This first layer 209 may be a metal glue to aid in the coupling of the first metal 203 and the second metal. As shown in FIG. 2J and FIG. 3J, the second metal 210 and 211 are applied into the remaining portion of the trench 207 and the via 208, respectively. In some embodiments, the second metal layer 209, 210, 211 may also be applied in one step such that a separate metal glue layer is not necessary.

Figure 3K:
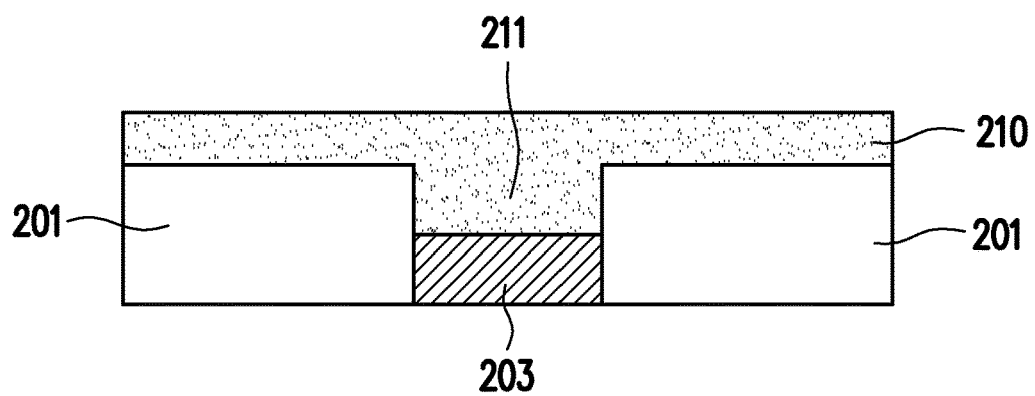
Figure 3L:
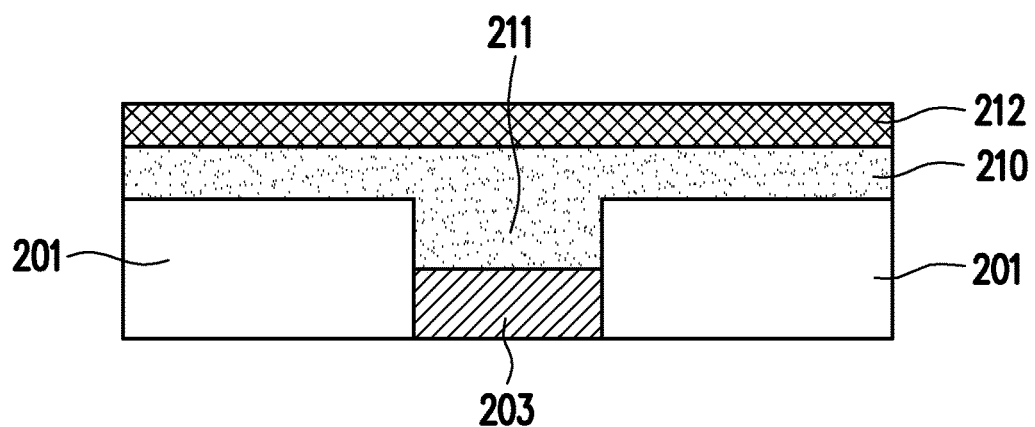

FIGS. 3K and 3L, illustrate a manner in which a third layer could be added to the semiconductor device. As illustrated, the second metal layer 210 can be etched and a further dielectric layer 212 could be added over the second metal layer 210.

Figure 4:
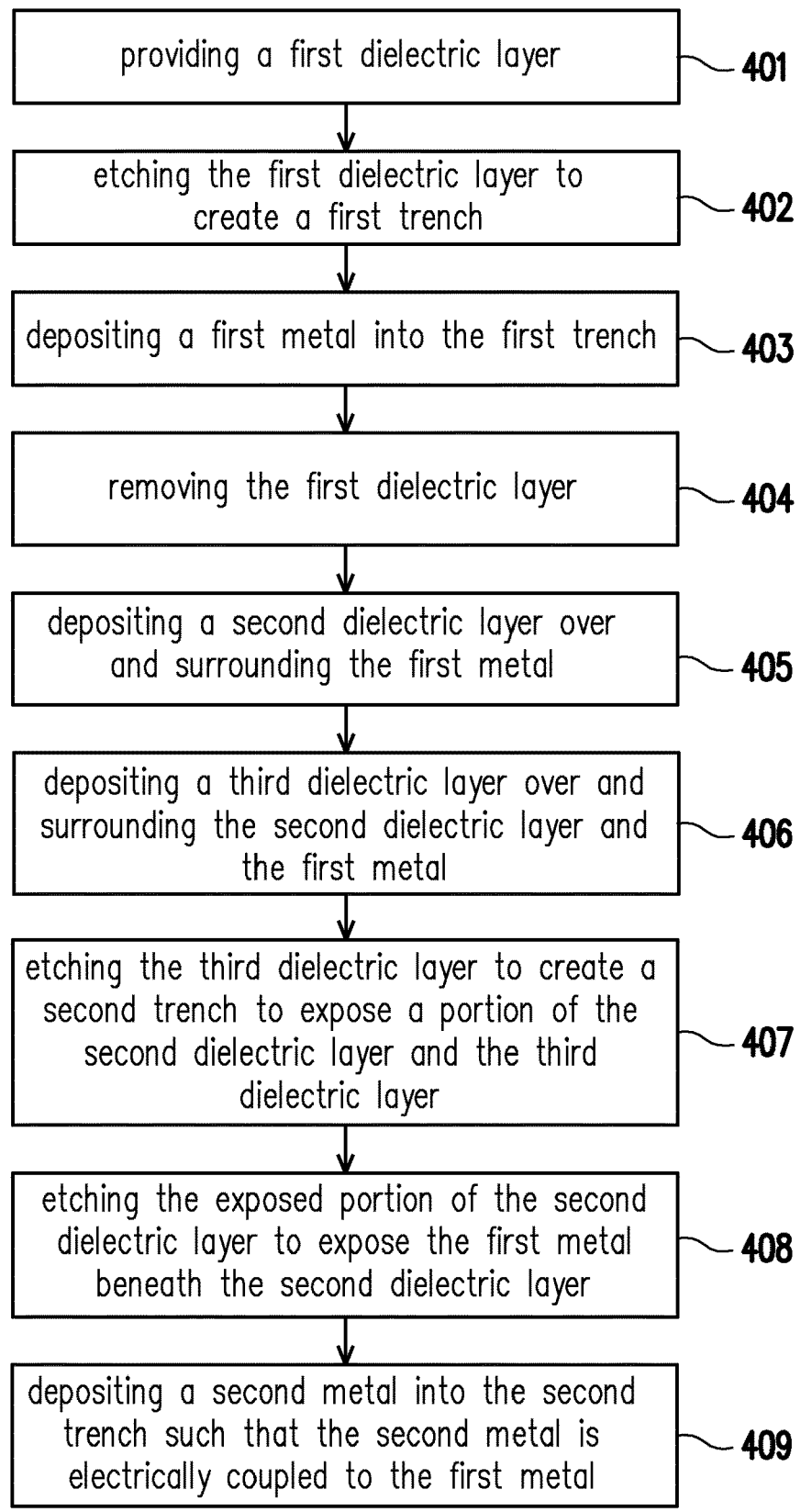
FIG. 4 is a flow chart illustrating a second method for fabricating a self aligned via, in accordance with some embodiments.

FIG. 4 is a flow chart illustrating a second method for fabricating a self aligned via, in accordance with some embodiments. FIG. 4 is discussed in conjunction with FIGS. 5A-5J and FIGS. 6A-6J which are schematic representations of the corresponding semiconductor device at various stages of fabrication. FIGS. 5A-5J are perspective views of a semiconductor device comprising a self aligned via at various stages of fabrication according to the second method described with respect to FIG. 4, in accordance with some embodiments. FIGS. 6A-6J are cross-sectional views of a semiconductor device comprising a self aligned via at various stages of fabrication according to the second method described with respect to FIG. 4, in accordance with some embodiments.

Figure 5A:
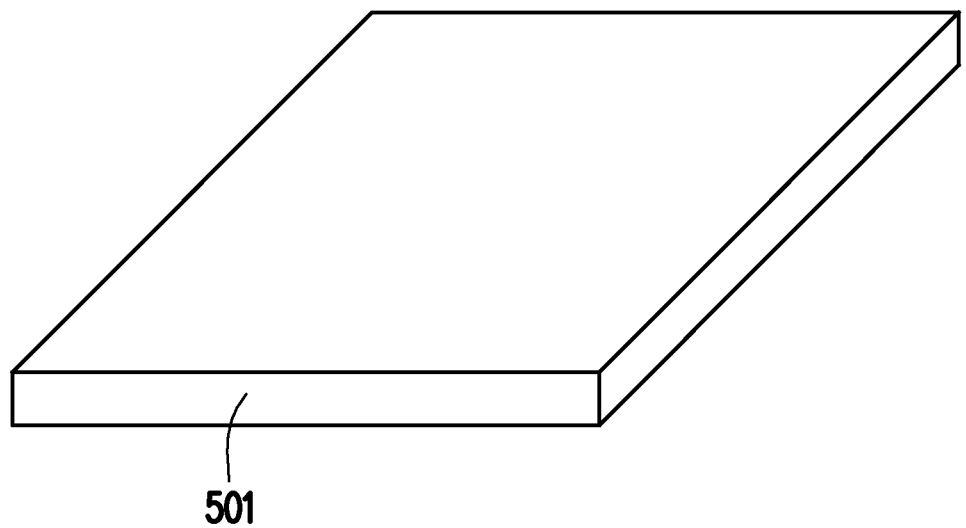
FIGS. 5A-5J are perspective views of a semiconductor device comprising a self aligned via at various stages of fabrication according to the second method described with respect to FIG. 4, in accordance with some embodiments.
Figure 5B:
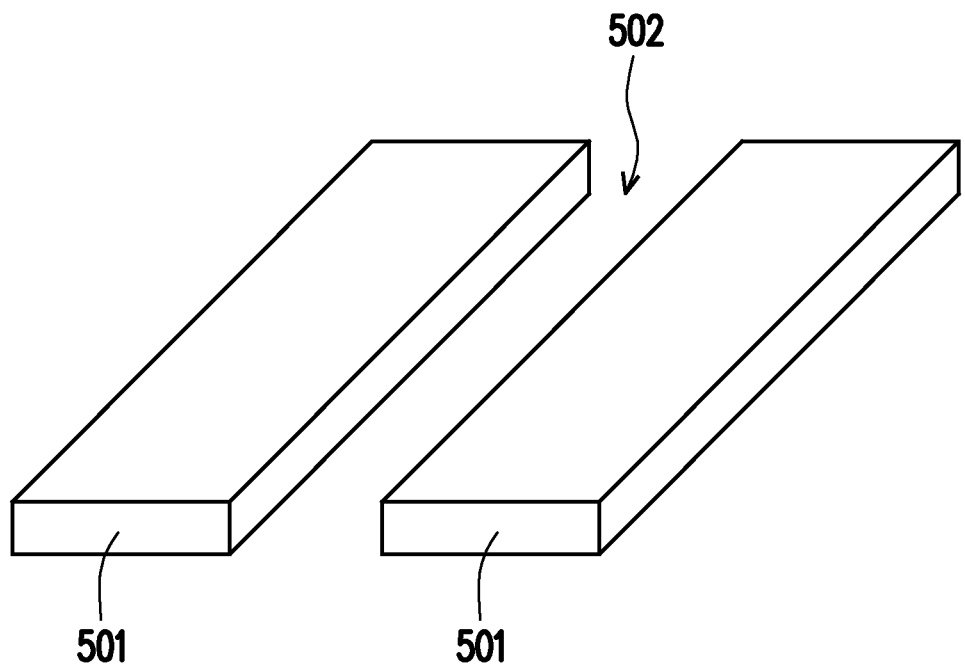
Figure 6A:
FIGS. 6A-6J are cross-sectional views of a semiconductor device comprising a self aligned via at various stages of fabrication according to the second method described with respect to FIG. 4, in accordance with some embodiments.
Figure 6B:
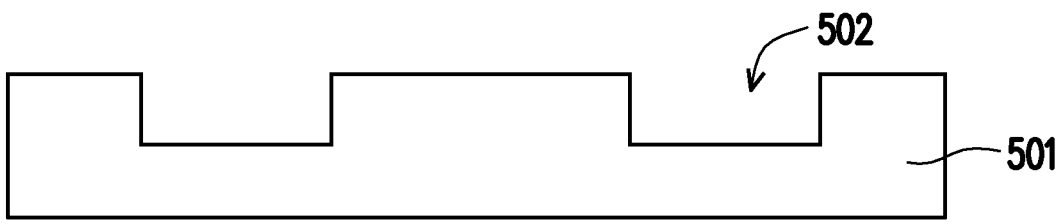

In this second embodiment, the fabrication process begins at operation 401 by providing a first dielectric layer 501. As discussed above with respect to the first embodiment, the dielectric layer 501 may be an inter metal dielectric (IMD) layer. Examples of acceptable dielectric layers include silicon oxide, silicon carbon oxide, silicon nitride, silicon carbon nitride, aluminum oxide, etc. FIG. 5A and FIG. 6A illustrate an example of dielectric layer 501. At operation 402, the first dielectric layer 501 is etched to create a first trench 502. The etching process may be performed by any of several processes (e.g., chemical, mechanical, etc.). Additionally, the first trench 502 may be fabricated such that it extends in a first direction as illustrated in FIG. 5B. FIG. 6B illustrates a cross-sectional view of the trench 502. In addition, in FIG. 6B, two trenches 502 and they are formed in such a manner that they do not extend entirely through the first dielectric layer 501.

Figure 5C:
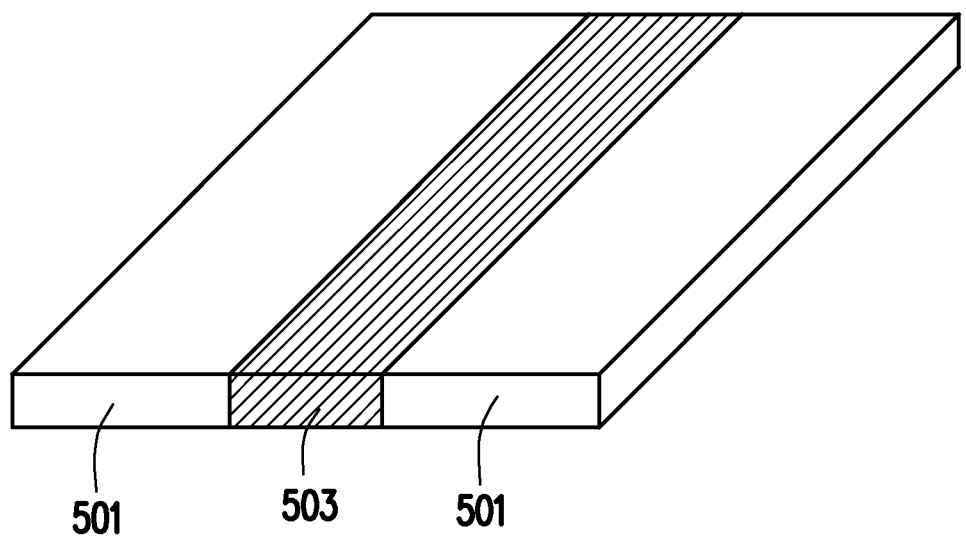
Figure 5D:
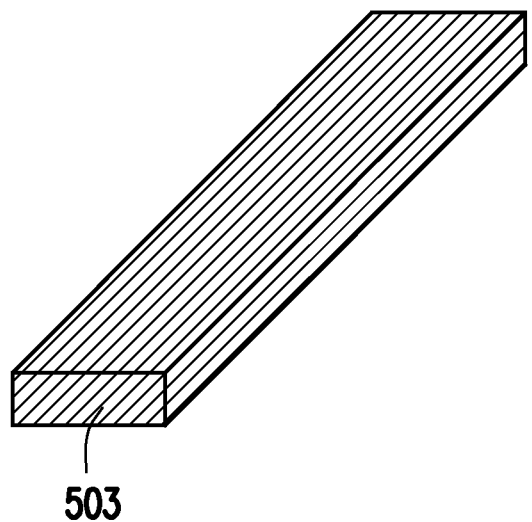
Figure 6C:
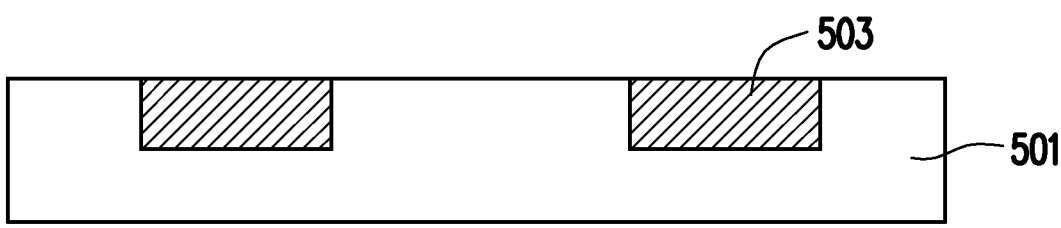
Figure 6D:
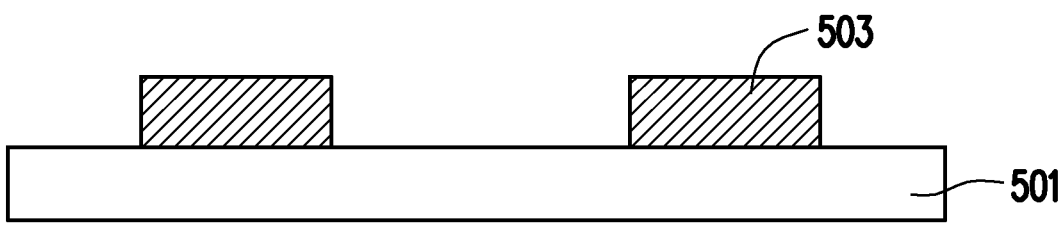

At operation 403, the trench 502 is filled with a first metal 503. The first metal 503 (as discussed with respect to the first embodiment) represents a conductive path on a certain layer of the semiconductor device. Acceptable metals for use as first metal 503 include copper, cobalt, tungsten, nickel, and combinations thereof. As illustrated in FIG. 5C and FIG. 6C, the first metal 503 may completely fill the trench 502. In some embodiments, the first metal 503 may not completely fill the trench 502. In operation 404, the first dielectric layer 501 is removed. As illustrated in FIG. 5D and FIG. 6D, the removal of first dielectric layer 501 causes the first metal 503 to be exposed (e.g., on at least three sides). As illustrated in FIG. 5D, the first dielectric layer 501 may be removed leaving just the first metal 503 or, as shown in FIG. 6D, the first dielectric layer 501 may be etched such that the first metal 503 is left on a dielectric substrate 501.

Figure 5E:
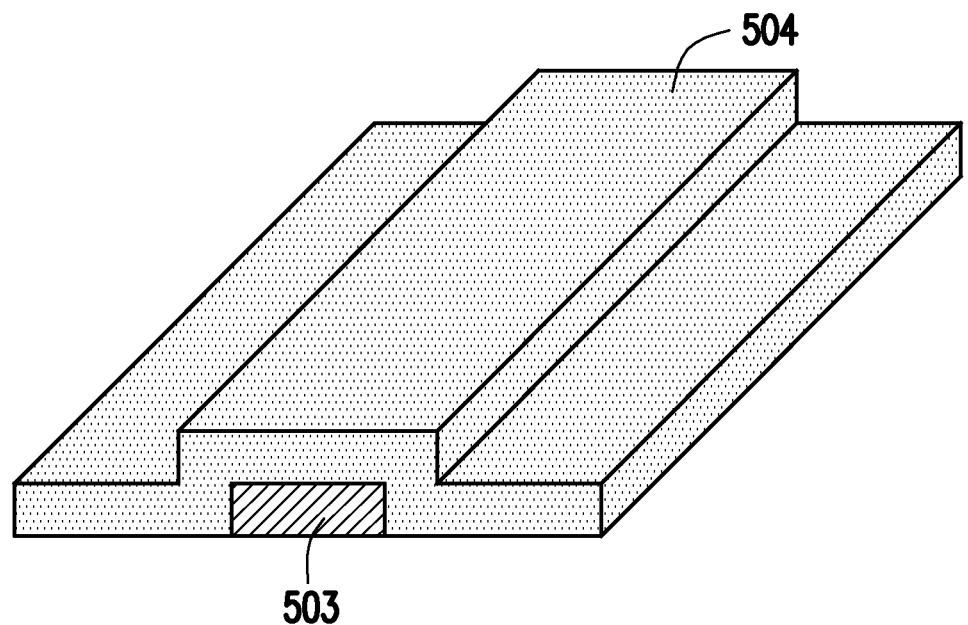
Figure 6E:
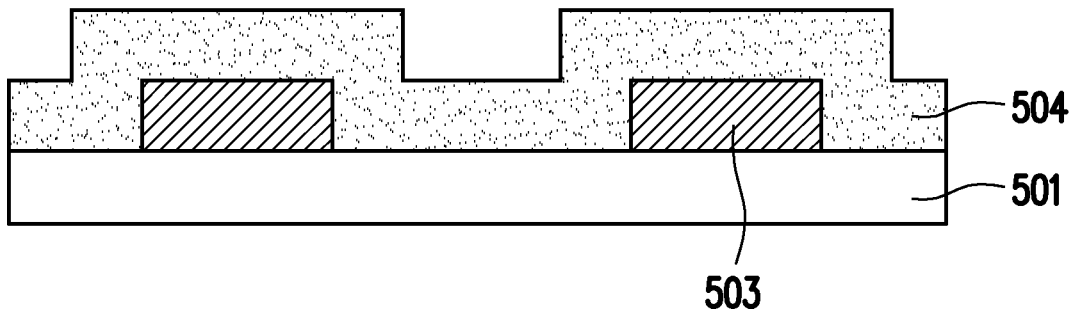

In operation 405, a second dielectric layer 504 is deposited over the first metal 503. As illustrated in FIG. 5E and FIG. 6E, the second dielectric layer 504 covers the first metal 503 (e.g., on at least three sides). Unlike in the previous embodiment, the second dielectric layer in this embodiment is not constrained by a trench. In some embodiments, the second dielectric layer 504 may completely cover the first metal 503 and the first dielectric layer 501, as illustrated in FIG. 5E and FIG. 6E. The second dielectric 504 and the first dielectric 501 may be different materials that have different etching sensitivities.

Figure 5F:
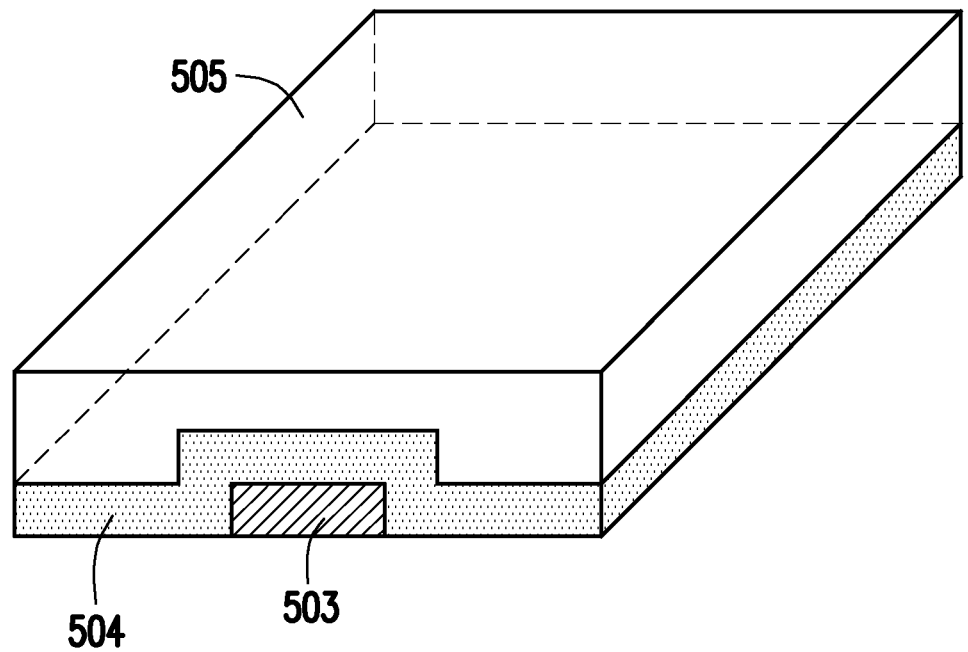
Figure 6F:
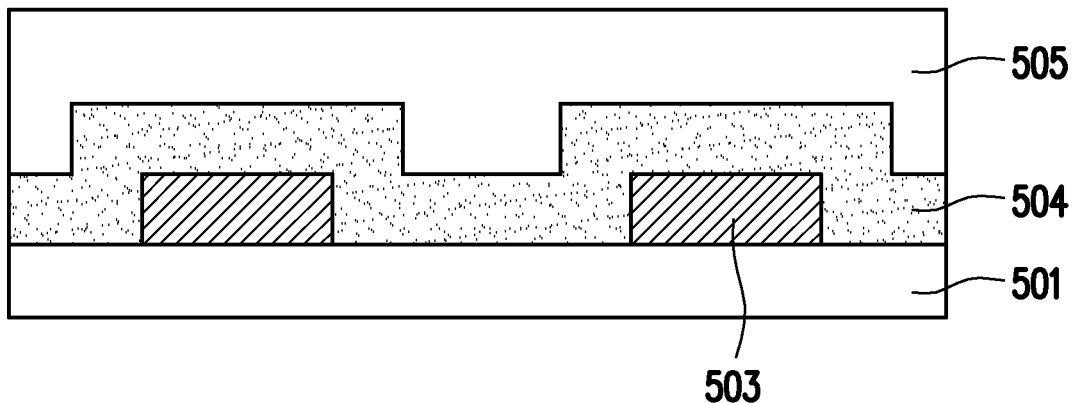
Figure 6G:
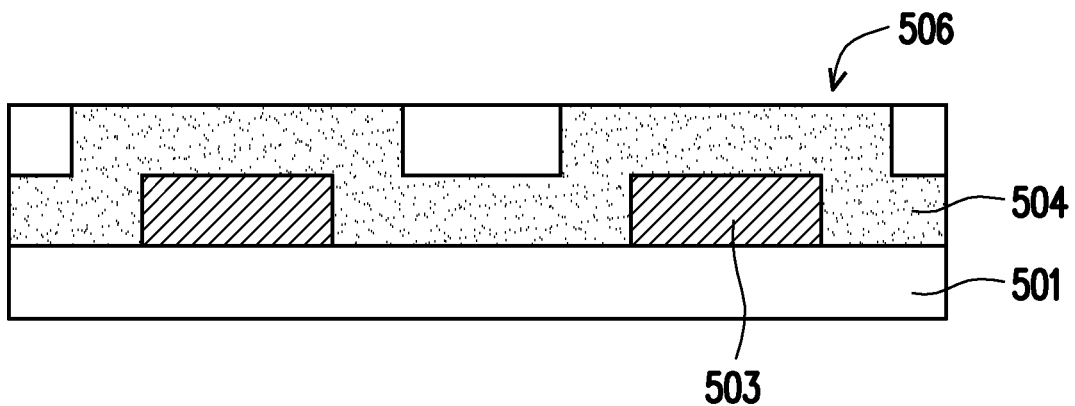

In operation 406, a third dielectric layer 505 is deposited over and surrounding the second dielectric layer 504 and the first dielectric layer 501 as shown in FIG. 5F and FIG. 6F. In some embodiments, the third dielectric layer 505 and the second dielectric layer 504 may be different materials that have different etching sensitivities. In some embodiments, the third dielectric layer 505 and the first dielectric layer 501 may be the same material or may be different materials that have different etching sensitivities.

Figure 5G:
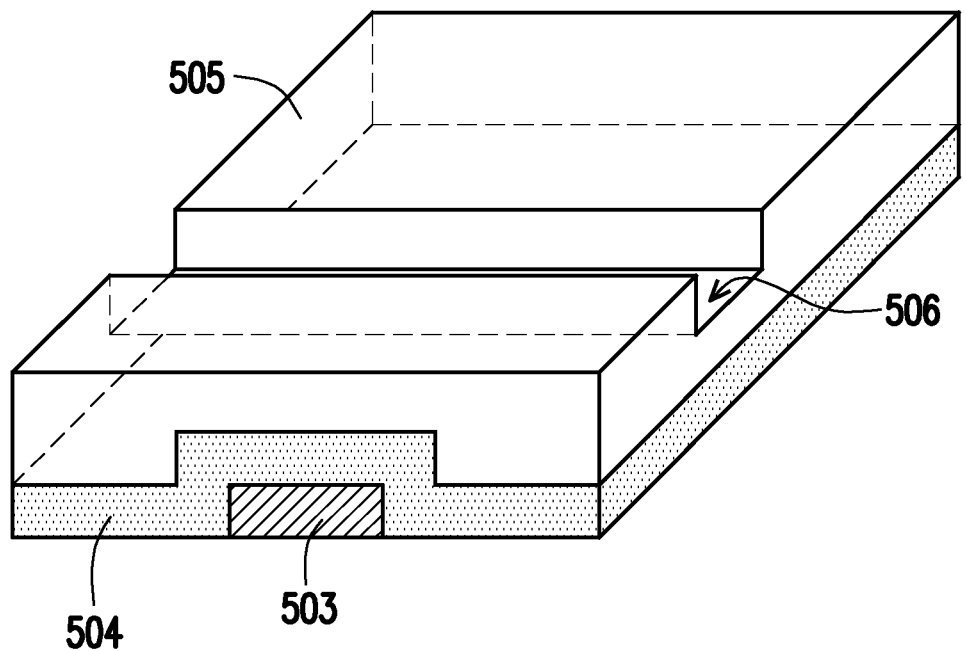
Figure 5H:
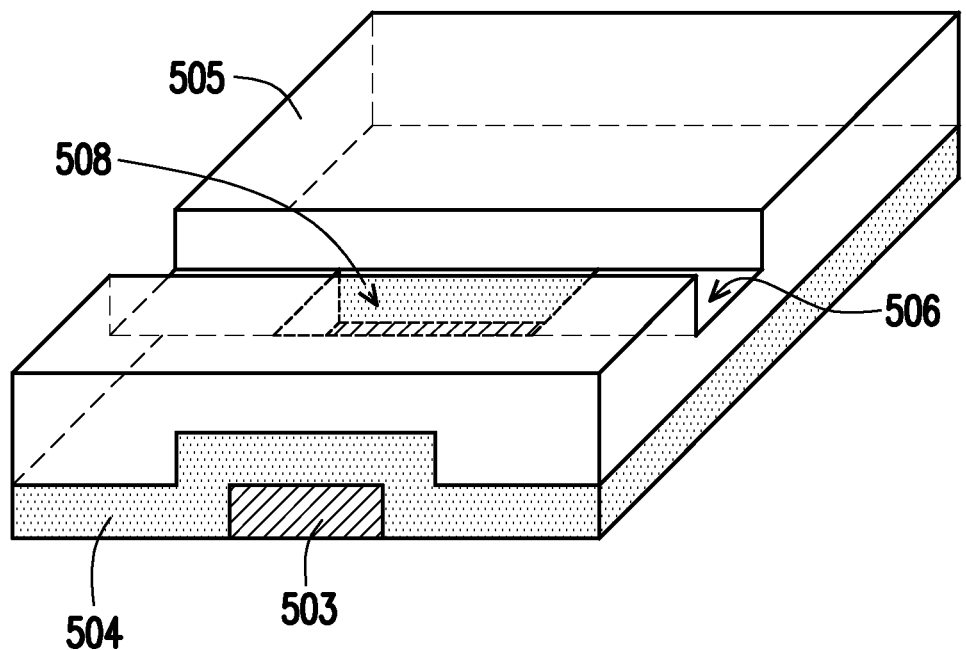
Figure 6H:
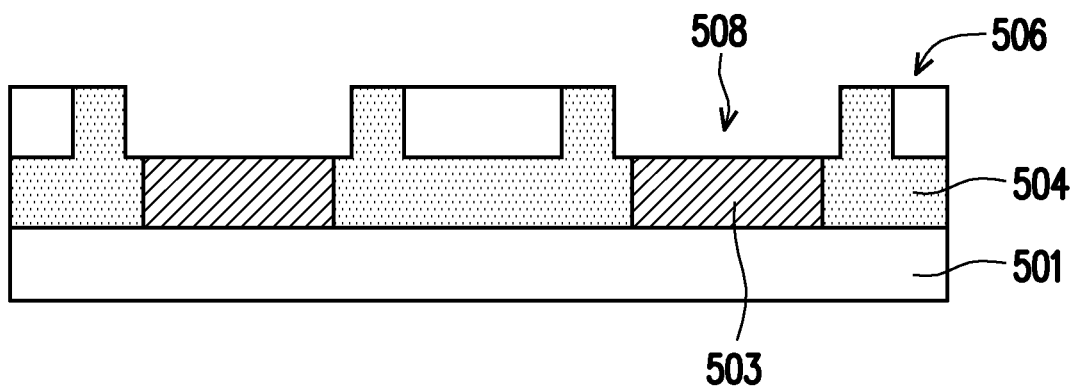

After the third dielectric layer 505 is deposited, the third dielectric layer 505 is etched to create a second trench 506 to expose a portion of the second dielectric layer 504 and lower portions of the third dielectric layer 505, in operation 407. As illustrated in FIG. 5G (and FIG. 6G which is a cross-sectional view of FIG. 5G taken across the length of the second trench 506), the second trench 506 may extend in a second direction that is different from the first direction that the first trench 502 extends. In some embodiments, the first direction and the second direction may be substantially perpendicular to one another. In operation 508, the exposed portion of the second dielectric layer 504 is selectively etched to expose a portion of the first metal 203. As discussed above, because the second dielectric layer 504 is a different material than the first dielectric layer 501 and the third dielectric material 505, the second dielectric layer 504 can be selectively etched. As illustrated in FIG. 5H and FIG. 6H, the third dielectric layer 505 bounds (or constrains) the second dielectric material on all four sides. Accordingly, when the second dielectric layer 504 is selectively etched, the resulting via 508 is self aligned over the first metal 503 because of the double trench created by the third dielectric layer 505.

Figure 5I:
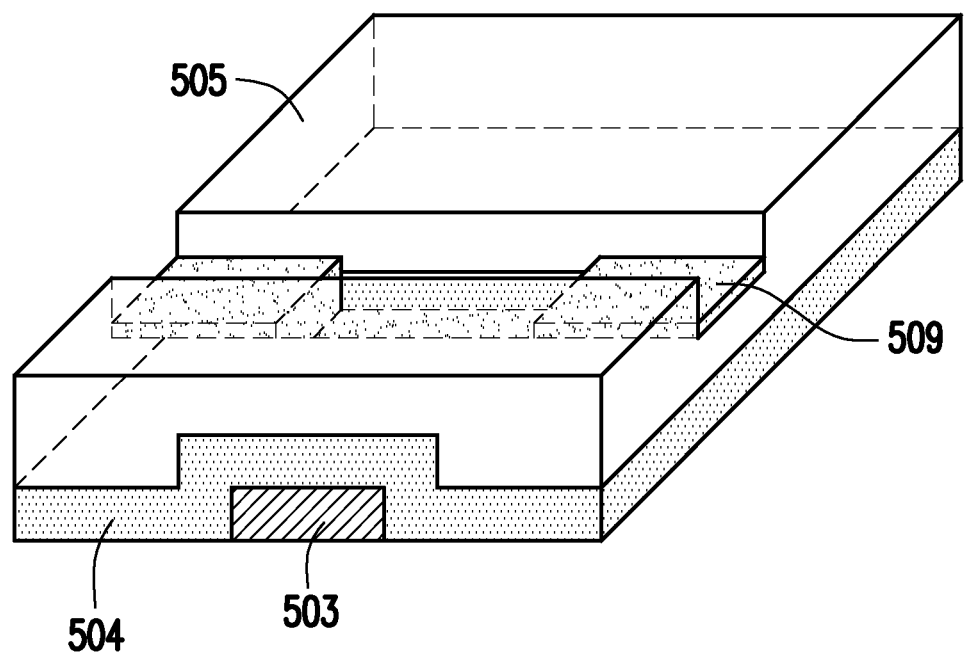
Figure 5J:
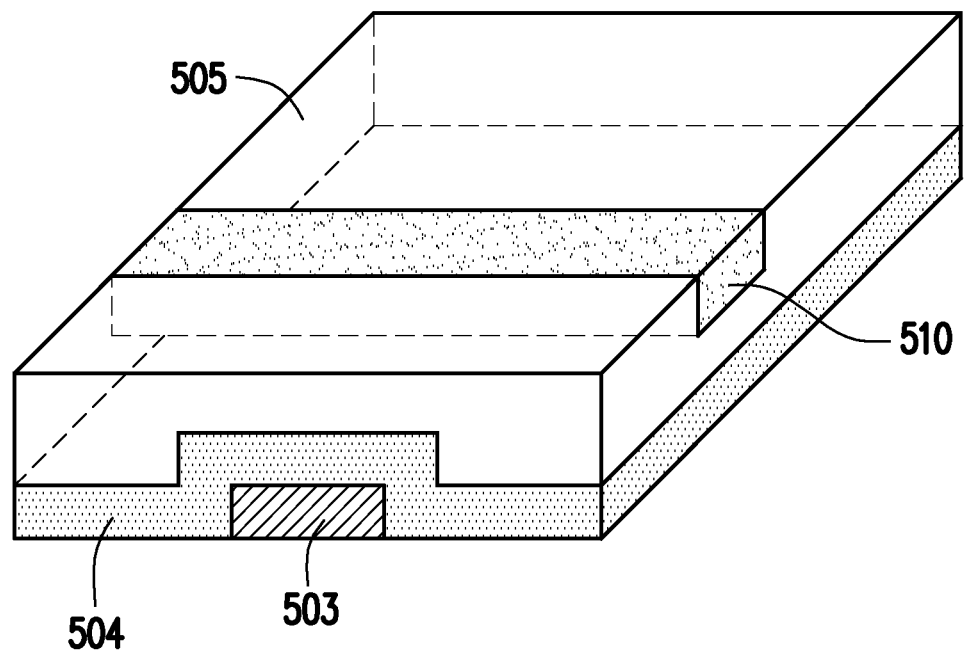
Figure 6I:
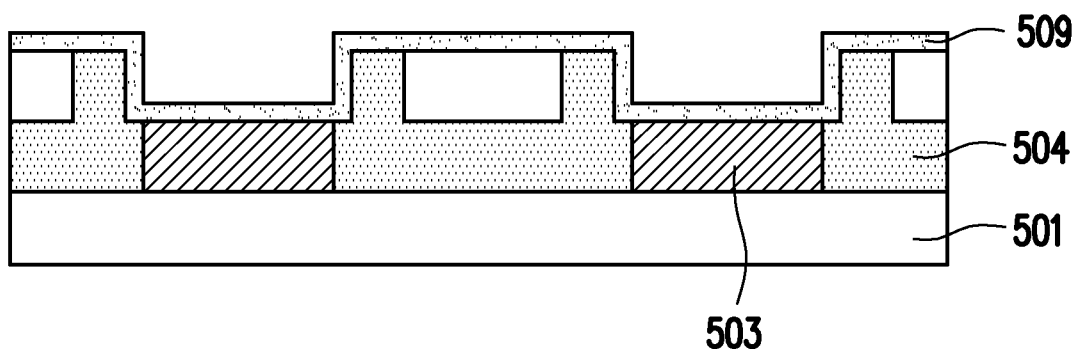
Figure 6J:
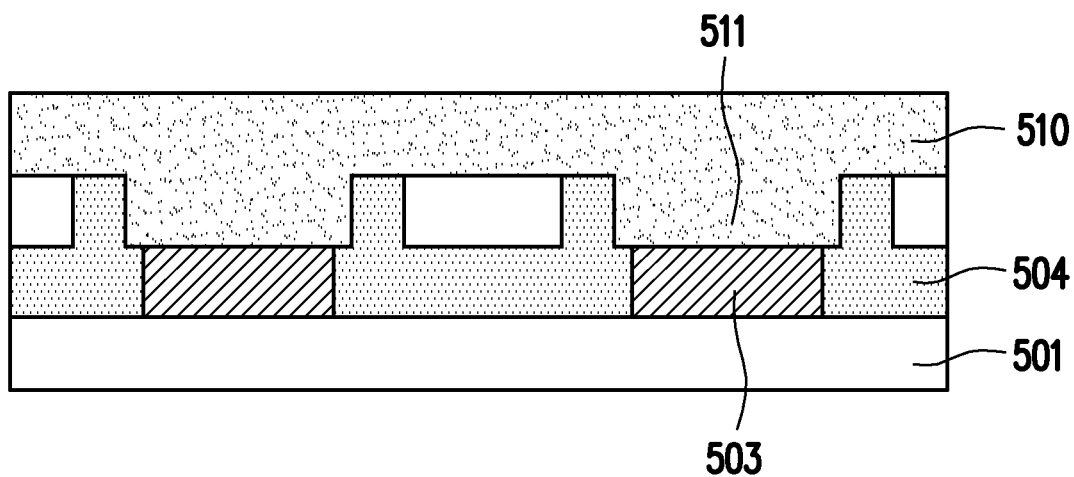

In operation 109, a second metal 509, 510, 511 is deposited into the second trench 507 such that the second metal is electrically coupled to the first metal 503. In some embodiments, this process may be completed in a single step or in two steps. FIG. 5I, FIG. 5J, FIG. 6I and FIG. 6J illustrate a two step process. As shown in FIG. 5I and FIG. 6I, a first layer 509 is applied into the trench 507 and via 508. This first layer 509 may be a metal glue to aid in the coupling of the first metal 503 and the second metal. As shown in FIG. 5J and FIG. 6J, the second metal 510 and 511 are applied into the remaining portion of the trench 507 and the via 508, respectively. In some embodiments, the second metal layer 509, 510, 511 may also be applied in one step such that a separate metal glue layer is not necessary.

Figure 7:
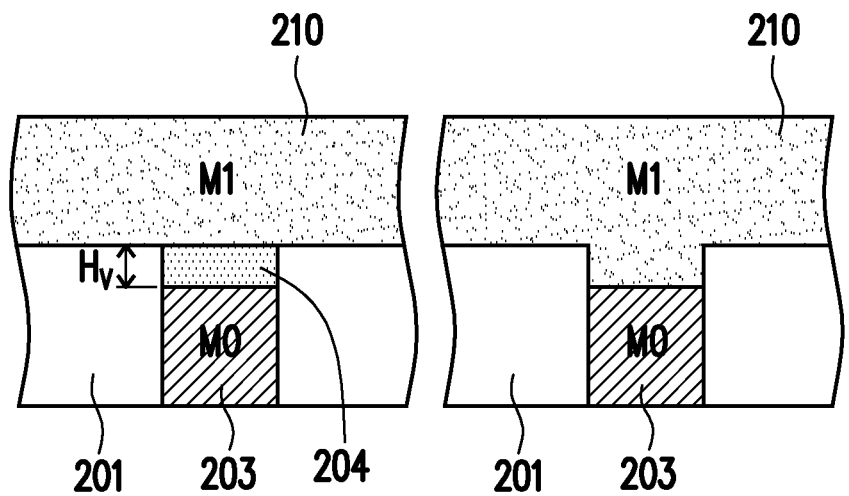
FIG. 7 is a cross-sectional view of certain aspects of the semiconductor device fabricated according to the first method described with respect to FIG. 1, in accordance with some embodiments.
Figure 8:
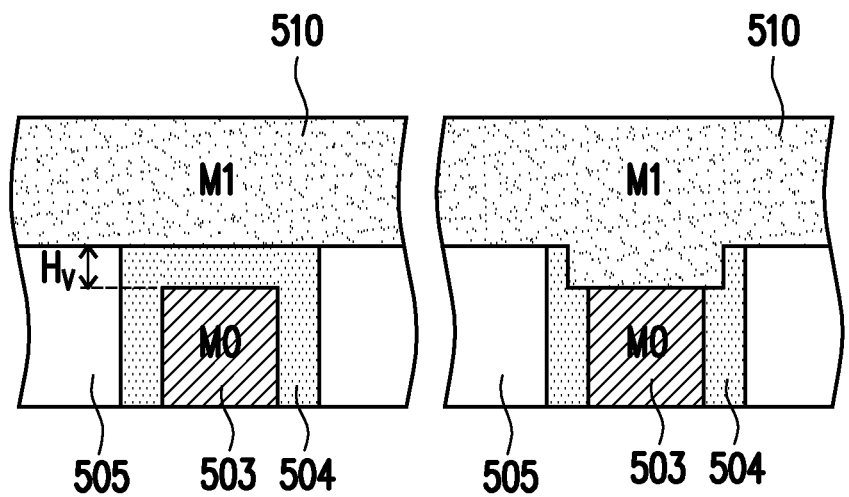
FIG. 8 is a cross-sectional view of certain aspects of the semiconductor device fabricated according to the second method described with respect to FIG. 4, in accordance with some embodiments.

FIG. 7 is a cross-sectional view of certain aspects of the semiconductor device fabricated according to the first method described with respect to FIG. 1, in accordance with some embodiments. FIG. 8 is a cross-sectional view of certain aspects of the semiconductor device fabricated according to the second method described with respect to FIG. 4, in accordance with some embodiments.

In FIG. 7, the cross-sectional view of the right portion of the figure is the same as the view illustrated in FIG. 3J—a via is formed to electrically couple first metal (M0) to second metal (M1). Similarly, in FIG. 8, the cross-sectional view of the right portion of the figure is the same as the view illustrated in FIG. 5J—a via is formed to electrically couple first metal (M0) to second metal (M1). In FIG. 7 and FIG. 8, the left portion of the figure illustrates a situation when a via is not formed to couple first metal (M0) to second metal (M1) at the intersection of the two conductive paths. As readily understood bey a person of skill in the art, in a semiconductor device, multiple conductive paths may be formed on a first layer and multiple conductive paths may be formed on a second layer (above or below) the first layer. These conductive paths may intersect in multiple locations, not all of which will include a via connecting the conductive paths from the different layers. In fact, depending on the intended operation of the semiconductor device, certain areas of intersection may have a via and others may not. The distinction in appearance between an intersection with a via and an intersection without a via can be seen in each of FIG. 7 and FIG. 8.

Additionally, as discussed above, the second dielectric layer 204, 504 may be a different material than the first dielectric material and the third dielectric material 201, 505. In some embodiments the material on top of the first metal 203, 503 may have different etching sensitivities than materials on the sides of the first metal 203, 503. For example, if the material on top of the first metal has an etching ration of 1, the material on the sides of the first metal 203, 503 may have an etching ratio of less than or about 0.5.

Referring again to FIG. 7 and FIG. 8, in some embodiments, to guard against misalignment and shorts, the via height ($H_V$) may be between 0.2 and 0.8 times the distance between adjacent metal lines (i.e., metal pitch). For example, in some embodiments, $H_V$ may be 0.2, 0.3, 0.4, 0.5, 0.6, 0.7, or 0.8 times the metal pitch.

Some embodiments described herein may include a method for fabricating a semiconductor device that includes depositing a first metal into a first trench of a first dielectric layer such that a top surface of the first metal is below a top surface of the first dielectric layer. Next, the method may include depositing a second dielectric layer over the first metal and depositing a third dielectric layer over the first dielectric layer and the second dielectric layer. The third dielectric layer is etched to create a second trench that exposes a portion of the first dielectric layer and a portion of the second dielectric layer. Next, the exposed portion of the second dielectric layer is etched to expose a portion of the first metal to create a via to the first metal.

Some embodiments described herein may include a method for fabricating a semiconductor device that includes providing a first dielectric layer, etching the first dielectric layer to create a first trench, and depositing a first metal into the first trench. The first dielectric material is then removed and a second dielectric layer is deposited over and surrounding the first metal. Next, the method includes depositing a third dielectric layer over and surrounding the second dielectric layer and the first metal and etching the third dielectric layer to create a second trench that exposes a portion of the second dielectric layer and a portion of lower layers of the third dielectric layer. The exposed portion of the second dielectric layer is etched to expose a portion of the first metal and a second metal is deposited into the second trench such that the second metal is electrically coupled to the first metal.

Some embodiments may include a method for fabricating a semiconductor device that includes forming a first trench and depositing a first metal into the first trench such that a top surface of the first metal is below a top surface of the first trench. Next, the process continues by depositing a dielectric layer over the first metal such that a top surface of the dielectric layer is at substantially the same level as the top surface of the first trench. A second trench is formed and then a via is formed by etching the portion of the dielectric layer exposed by the overlapping region between the first trench and the second trench. The via exposes a portion of the first metal a second metal is deposited into the second trench such that the second metal is electrically coupled to the first metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for fabricating a semiconductor device, comprising:
    depositing a first metal into a first trench of a first dielectric layer such that a top surface of the first metal is below a top surface of the first dielectric layer;
    removing the first dielectric layer to expose the first metal on the top surface of the first metal and two sides of the first metal;
    depositing a second dielectric layer over the first metal such that the second dielectric layer surrounds the top and the two sides of the first metal;
    depositing a third dielectric layer over the first dielectric layer and the second dielectric layer;
    etching the third dielectric layer to create a second trench that exposes a portion of the first dielectric layer and a portion of the second dielectric layer; and
    etching the exposed portion of the second dielectric layer to expose a portion of the first metal to create a via to the first metal; and
    wherein an etching ratio of a material of the second dielectric layer is greater than an etching ratio of a material of the third dielectric layer.

2. The method of claim 1, further comprising depositing a second metal into the second trench such that the second metal is electrically coupled to the first metal.

3. The method of claim 1, wherein the first dielectric layer and the second dielectric layer have different etching sensitivities.

4. The method of claim 1, wherein the third dielectric layer and the second dielectric layer have different etching sensitivities.

5. The method of claim 1, wherein the third dielectric layer and the first dielectric layer are the same material.

6. The method of claim 1, wherein the first metal represents a first conductive path on a certain layer of the semiconductor device and the second metal represents a second conductive path on a different layer of the semiconductor device coupled to the first conductive path by the via formed by etching the second dielectric layer.

7. The method of claim 1, wherein the first trench extends in a first direction and the second trench extends in a second direction that is different from the first direction.

8. The method of claim 5, wherein the first direction and the second direction are substantially perpendicular to one another.

9. The method of claim 1, wherein at least one of the first dielectric layer, the second dielectric layer, and the third dielectric layer is a silicon oxide layer, silicon carbon oxide, silicon nitride layer, silicon carbon nitride layer, or an aluminum oxide layer.

10. The method of claim 1, wherein a height of the via is between 0.2 and 0.8 times a metal pitch of the semiconductor device.

11. The method of claim 1, wherein the first metal and the second metal are at least one of copper, cobalt, tungsten, nickel, and combinations thereof.

12. A method for fabricating a semiconductor device, comprising:
    providing a first dielectric layer;
    etching the first dielectric layer to create a first trench;
    depositing a first metal into the first trench;
    removing the first dielectric material;
    depositing a second dielectric layer over the first metal such that the second dielectric layer surrounds a top and two sides of the first metal;
    depositing a third dielectric layer over and surrounding the second dielectric layer and the first metal;
    etching the third dielectric layer to create a second trench that exposes a portion of the second dielectric layer and a portion of lower layers of the third dielectric layer;
    etching the exposed portion of the second dielectric layer to expose a portion of the first metal; and
    depositing a second metal into the second trench such that the second metal is electrically coupled to the first metal; and
    wherein an etching ratio of a material of the second dielectric layer is greater than an etching ratio of a material of the third dielectric layer.

13. The method of claim 12, wherein the third dielectric layer and the second dielectric layer have different etching sensitivities.

14. The method of claim 12, wherein the first metal represents a first conductive path on a certain layer of the semiconductor device and the second metal represents a second conductive path on a different layer of the semiconductor device coupled to the first conductive path by a via formed by etching the second dielectric layer.

15. The method of claim 12, wherein the first trench extends in a first direction and the second trench extends in a second direction that is different from the first direction.

16. The method of claim 15, wherein the first direction and the second direction are substantially perpendicular to one another.

17. The method of claim 12, wherein at least one of the first dielectric layer, the second dielectric layer, and the third dielectric layer is a silicon oxide layer, silicon carbon oxide, silicon nitride layer, silicon carbon nitride layer, or an aluminum oxide layer.

18. A method for fabricating a semiconductor device, comprising:
    forming a first trench in a first dielectric layer;
    depositing a first metal into the first trench such that a top surface of the first metal is below a top surface of the first trench;
    depositing a second dielectric layer over the first metal such that the second dielectric layer surrounds a top of the first metal;
    depositing a third dielectric layer over and surrounding the second dielectric layer and the first metal;
    forming a second trench in the third dielectric layer, the second trench exposes a portion of the second dielectric layer and a portion of the third dielectric layer;
    forming a via by etching the exposed portion of the second dielectric layer to expose a portion of the first metal; and
    depositing a second metal into the second trench such that the second metal is electrically coupled to the first metal; and
    wherein an etching ratio of a material of the second dielectric layer is greater than an etching ratio of a material of the third dielectric layer.

19. The method of claim 18, wherein the first metal represents a first conductive path on a certain layer of the semiconductor device and the second metal represents a second conductive path on a different layer of the semiconductor device coupled to the first conductive path by the via formed by etching the second first dielectric layer.

20. The method of claim 18, wherein the third dielectric layer and the second dielectric layer have different etching sensitivities.

* * * * *